United States Patent
Jeong

(10) Patent No.: US 10,566,386 B2
(45) Date of Patent: Feb. 18, 2020

(54) VARIABLE RESISTANCE MEMORY DEVICE AND METHOD OF MANUFACTURING THE SAME

(71) Applicant: Samsung Electronics Co., Ltd., Suwon-si (KR)

(72) Inventor: Ji-Hyun Jeong, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/990,913

(22) Filed: May 29, 2018

(65) Prior Publication Data

US 2019/0123277 A1 Apr. 25, 2019

(30) Foreign Application Priority Data

Oct. 23, 2017 (KR) ........................ 10-2017-0137413

(51) Int. Cl.
*H01L 27/24* (2006.01)
*H01L 45/00* (2006.01)

(52) U.S. Cl.
CPC ...... *H01L 27/2427* (2013.01); *H01L 27/2463* (2013.01); *H01L 45/06* (2013.01); *H01L 45/126* (2013.01); *H01L 45/1233* (2013.01); *H01L 45/144* (2013.01); *H01L 45/147* (2013.01); *H01L 45/16* (2013.01); *H01L 45/1683* (2013.01)

(58) Field of Classification Search
CPC ... H01L 27/2409–2427; H01L 27/2463; H01L 27/2481; H01L 45/1233; H01L 45/126; H01L 45/1683; H01L 45/16
See application file for complete search history.

(56) References Cited

U.S. PATENT DOCUMENTS

| | | |
|---|---|---|
| 7,901,979 B2 | 3/2011 | Lung |
| 8,349,636 B2 | 1/2013 | Lee et al. |
| 8,853,047 B2 | 10/2014 | Lung et al. |
| 9,306,165 B2 | 4/2016 | Lee et al. |
| 9,444,043 B2 | 9/2016 | Pellizzer et al. |
| 9,559,147 B2 | 1/2017 | Eun |
| 9,806,129 B2 | 10/2017 | Ravasio et al. |

(Continued)

FOREIGN PATENT DOCUMENTS

| | | |
|---|---|---|
| JP | 5279879 B2 | 9/2013 |
| KR | 10-2016-0143218 | 12/2016 |

*Primary Examiner* — Zandra V Smith
*Assistant Examiner* — Molly K Reida
(74) *Attorney, Agent, or Firm* — Muir Patent Law, PLLC

(57) ABSTRACT

A method of manufacturing a variable memory device includes forming a switching layer on a first conductive layer, forming a heating layer on the switching layer, the heating layer extending in a first direction, performing a first patterning process on the first conductive layer, the switching layer, and the heating layer to form a first trench extending in a second direction intersecting the first direction, forming variable resistance patterns on the heating layer, forming a second conductive layer on the variable resistance patterns, and performing a second patterning process on the switching layer, the heating layer, and the second conductive layer to form a second trench extending in the first direction and being between the variable resistance patterns.

10 Claims, 17 Drawing Sheets

(56) References Cited

U.S. PATENT DOCUMENTS

| | | | |
|---|---|---|---|
| 2012/0305522 A1* | 12/2012 | Park | H01L 45/06 216/13 |
| 2013/0126510 A1* | 5/2013 | Oh | H01L 27/0296 219/209 |
| 2015/0340408 A1* | 11/2015 | Russo | H01L 27/2445 257/5 |
| 2016/0181321 A1* | 6/2016 | Jung | H01L 45/06 257/4 |
| 2017/0133433 A1 | 5/2017 | Lee et al. | |
| 2018/0151623 A1* | 5/2018 | Terai | C23C 16/34 |

* cited by examiner

VARIABLE RESISTANCE MEMORY DEVICE AND METHOD OF MANUFACTURING THE SAME

CROSS-REFERENCE TO RELATED APPLICATION

This application claims the benefit of priority under 35 U.S.C. § 119 to Korean Patent Application No. 10-2017-0137413, filed on Oct. 23, 2017, in the Korean Intellectual Property Office, the disclosure of which is hereby incorporated by reference in its entirety.

TECHNICAL FIELD

The present disclosure relates to a variable resistance memory device and a method of manufacturing the same.

DISCUSSION OF RELATED ART

Semiconductor devices can be classified into a memory device and a logic device. The semiconductor memory devices include a volatile memory device and a nonvolatile memory device. While the volatile memory device loses stored data when power supply is interrupted, the nonvolatile memory device can retain stored data even when the power supply is interrupted.

In accordance with increased demand for high performance and lower power semiconductor memory devices, non-volatile memory devices, such as a ferroelectric access memory (FRAM), a magnetic random access memory (MRAM), and a phase-change random access memory (PRAM) have been developed. Materials of such non-volatile memory devices have a variable resistance depending on a current or voltage applied thereto, and maintain a uniform resistance even after the current or voltage supply is interrupted.

SUMMARY

According to example embodiments, a method of manufacturing a variable resistance memory device may include forming a switching layer on a first conductive layer, forming a heating layer on the switching layer, the heating layer extending in a first direction, performing a first patterning process on the first conductive layer, the switching layer, and the heating layer to form a first trench extending in a second direction intersecting the first direction, forming variable resistance patterns on the heating layer, forming a second conductive layer on the variable resistance patterns, and performing a second patterning process on the switching layer, the heating layer, and the second conductive layer to form a second trench extending in the first direction and being between the variable resistance patterns.

According to example embodiments, a method of manufacturing a variable resistance memory device may include forming first conductive lines extending in a first direction, forming second conductive lines extending in a second direction intersecting the first direction; and forming first memory cells disposed at intersections between the first conductive lines and the second conductive lines. Each of the first memory cells may include a switching element, an intermediate electrode, a heating pattern, and a variable resistance pattern that are connected in series between each of the first conductive lines and each of the second conductive lines. The heating pattern may include a bottom part and a side part. The bottom part may be electrically connected to the intermediate electrode and extend in the first direction. The side part may extend from an end portion of the bottom part toward the variable resistance pattern.

According to example embodiments, a method of manufacturing a variable resistance memory device may include sequentially forming a first conductive layer, a first switching layer, and a first heating layer, the first heating layer extending in a first direction, patterning the first conductive layer, the first switching layer, and the first heating layer to form a first trench extending in a second direction intersecting the first direction, forming first variable resistance patterns on the first heating layer, stacking a second conductive layer, a second switching layer, and a second heating layer on the first variable resistance patterns, the second heating layer extending in the second direction, patterning the first switching layer, the first heating layer, the second conductive layer, the second switching layer, and the second heating layer to form a second trench extending in the first direction, the second trench being between the first variable resistance patterns, forming second variable resistance patterns on the second heating layer, forming a third conductive layer on the second variable resistance patterns, and patterning the second switching layer, the second heating layer, and the third conductive layer to form a third trench extending in the second direction, the third trench being between the second variable resistance patterns.

DETAILED DESCRIPTION

Figure 1:
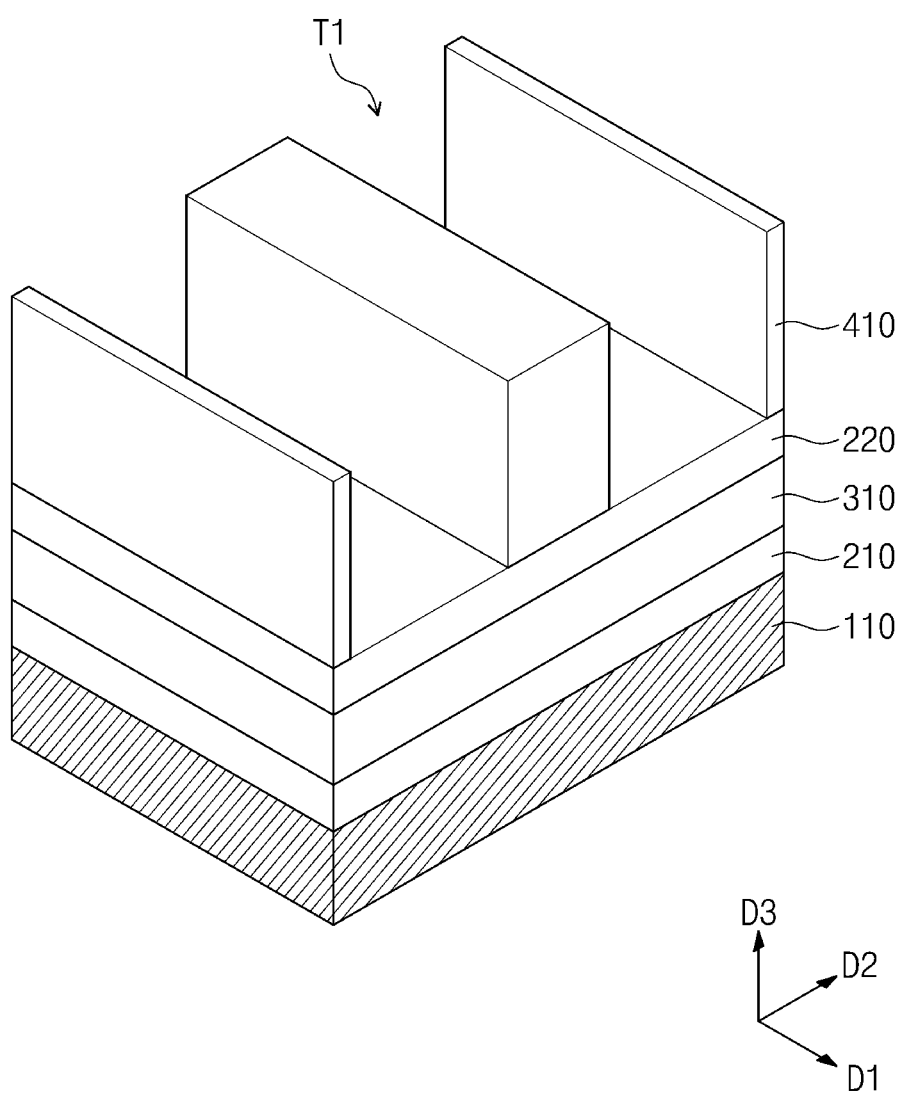
FIGS. 1 to 10 are perspective views illustrating a method of manufacturing a variable resistance memory device, according to example embodiments.

Various example embodiments will now be described more fully hereinafter with reference to the accompanying drawings. Like reference numerals may refer to like elements throughout this application.

FIGS. 1 to 10 are perspective views illustrating a method of manufacturing a variable resistance memory device, according to example embodiments.

Referring to FIG. 1, a first conductive layer 110, a first preliminary electrode layer 210, a first switching layer 310, and a second preliminary electrode layer 220 are sequentially stacked on a substrate (not shown). The first conductive layer 110 may include metal, e.g., Cu or Al, and/or conductive metal nitride, e.g., TiN or WN. The first and second preliminary electrode layers 210 and 220 may include a conductive material, e.g., W, Ti, Al, Cu, C, and/or CN. The first switching layer 310 may include an element based on a threshold switching phenomenon having a non-linear (e.g., S-shaped) I-V curve. For example, the first switching layer 310 may be an ovonic threshold switch (OTS) element having a bi-directional property. The first switching layer 310 may include a compound formed by combination of at least one of chalcogen elements, e.g., Te and Se, and at least one of Ge, Sb, Bi, Al, Pb, Sn, Ag, As, S, Si, In, Ti, Ga and P. The first switching layer 310 may further include a thermally stabilizing element, e.g., at least one of C, N, and O. For example, the first switching layer 310 may include AsTe, AsSe, GeTe, SnTe, GeSe, SnTe, SnSe, Zinc Telluride (ZnTe), AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and/or GeAsBiTe.

A first insulating layer 410 is formed on the second preliminary electrode layer 220. For example, the first insulating layer 410 may be formed by depositing an insulating material on the second preliminary electrode layer 220 and then etching the insulating material. The first insulating layer 410 includes at least one first trench T1. The first trench T1 may extend in a first direction D1. The first trench T1 may expose a portion of an upper surface of the second preliminary electrode layer 220. The first insulating layer 410 may include, e.g., silicon nitride.

Figure 2:
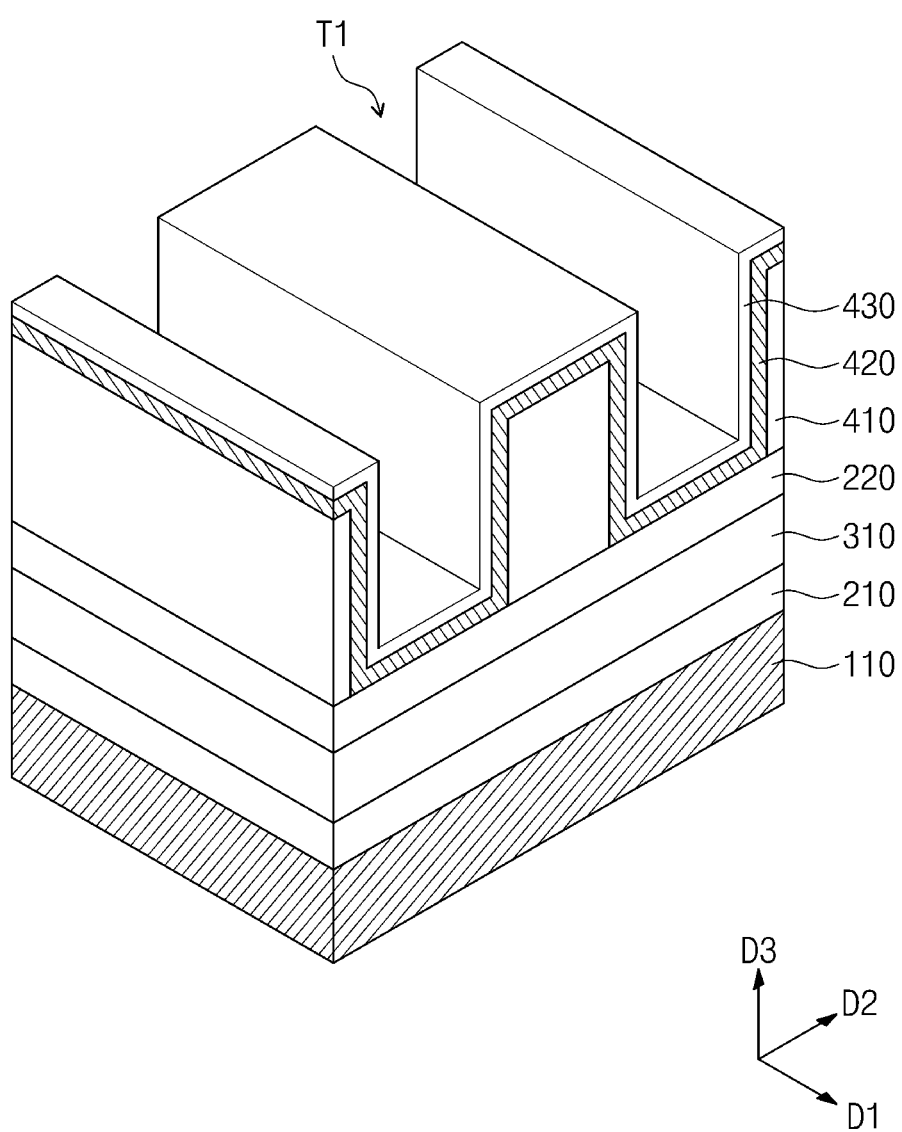

Referring to FIG. 2, a first conductive film 420 and a first spacer film 430 are formed on the second preliminary electrode layer 220. The first conductive film 420 may be conformally formed along sidewalls of the first insulating layer 410 exposed by the first trench T1, an upper surface of the first insulating layer 410, and the exposed upper surface of the second preliminary electrode layer 220. For example, the first conductive film 420 may be conformally formed along a bottom surface and side surfaces of the first trench T1 and the upper surface of the first insulating layer 410. The first spacer film 430 may be formed to conformally cover an upper surface of the first conductive film 420.

The first conductive film 420 may include a conductive material, e.g., W, Ti, Al, Cu, C, CN, TiN, TiAlN, TiSiN, TiCN, WN, CoSiN, WSiN, TaN, TaCN, TaSiN, and/or TiO.

The first spacer film 430 may include an insulating material, e.g., silicon oxide. Alternatively, the first spacer film 430 may include a conductive material, e.g., polysilicon. The first spacer film 430 may have an etch selectivity with respect to the first insulating layer 410 and the second preliminary electrode layer 220.

Figure 3:
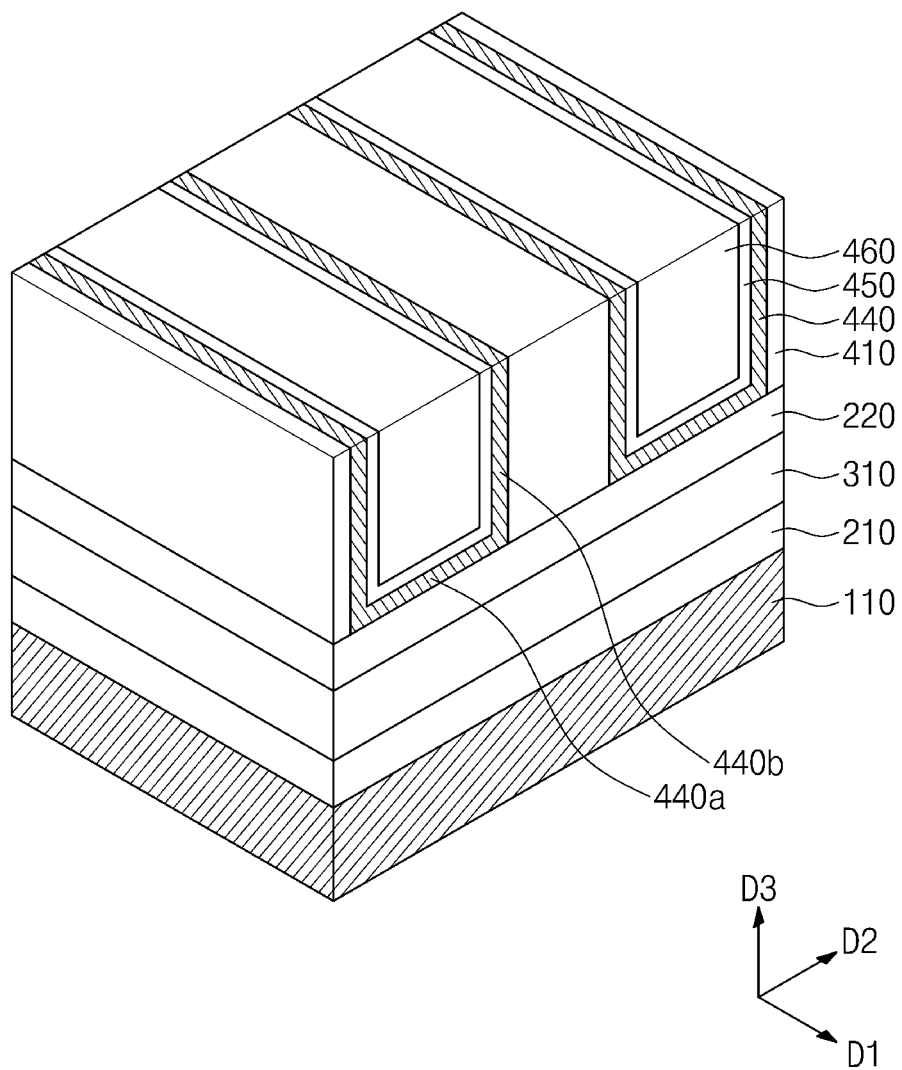

Referring to FIG. 3, a second insulating layer 460 is formed in the first trench T1. For example, after depositing an insulating material on the first spacer film 430 to fill the first trench T1, a planarization process may be performed on the first conductive film 420, the first spacer film 430, and the insulating material to expose the upper surface of the first insulating layer 410. Thus, a first heating layer 440, a second spacer film 450, and the second insulating layer 460 sequentially are formed in the first trench T1. The first insulating layer 410, the first heating layer 440, the second spacer film 450, and the second insulating layer 460 may each extend in the first direction D1. The first heating layer 440 may have a U-shaped cross-section. For example, the first heating layer 440 includes a bottom section 440a in contact with the second preliminary electrode layer 220 and side sections 440b extending upward from both end portions of the bottom section 440a in a third direction D3 perpendicular to the first direction D1. The side sections 440b may be spaced apart from each other with the bottom section 440a therebetween, in a second direction D2 intersecting the first direction D1 and perpendicular to the third direction D3. The second spacer film 450 may conformally cover the first heating layer 440 and have substantially the same cross-section (e.g., U-shaped cross-section) as the first heating layer 440.

The second insulating layer 460 may include an insulating material having an etch selectivity with respect to the second spacer film 450. For example, the second insulating layer 460 may include silicon nitride.

Figure 4:
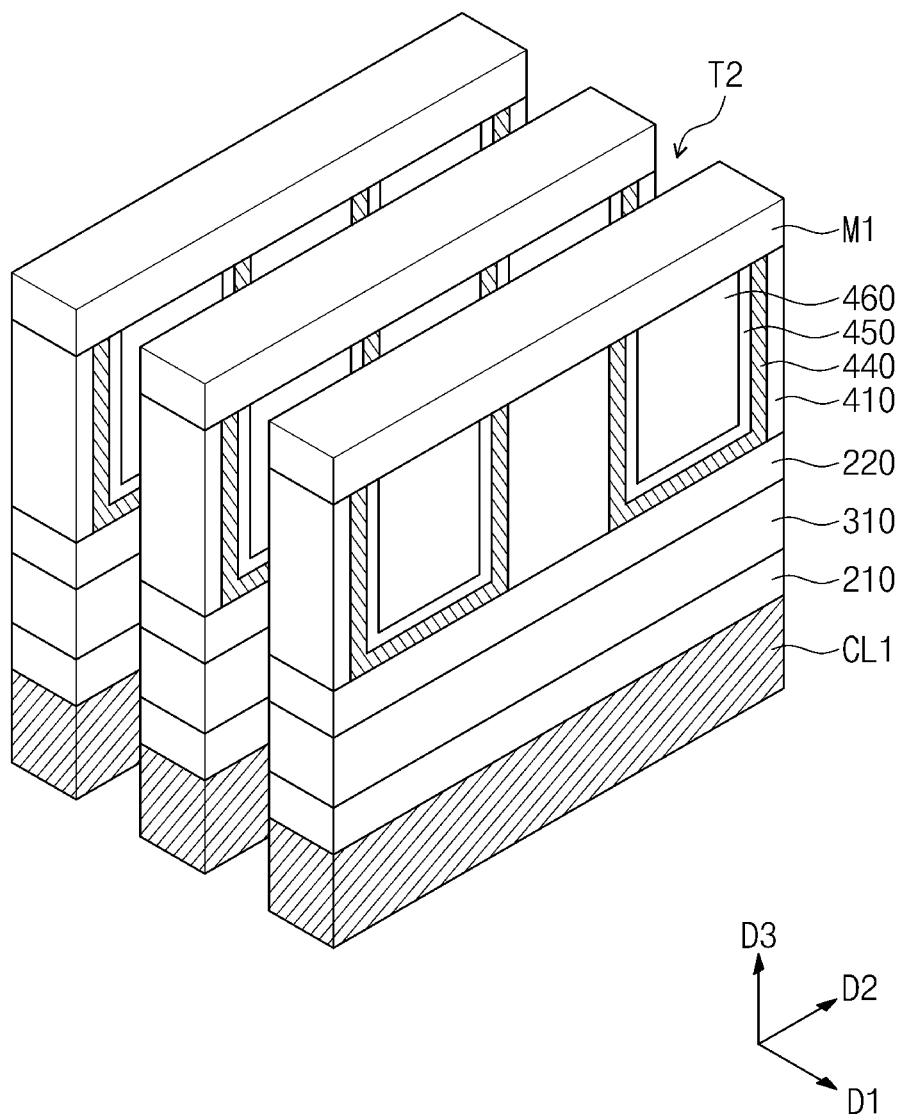

Referring to FIG. 4, first mask patterns M1 are formed on the first insulating layer 410, the first heating layer 440, the second spacer film 450, and the second insulating layer 460. The first mask patterns M1 may extend parallel to each other, in the second direction D2. The first mask patterns M1 may expose the first insulating layer 410, the first heating layer 440, the second spacer film 450, and the second insulating layer 460. The first mask patterns M1 may include, e.g., silicon oxide, silicon nitride, and/or polysilicon.

A first patterning process is performed on the second insulating layer 460. For example, an etching process may be performed using the first mask patterns M1 as an etch mask. By the first patterning process, at least one second trench T2 is formed to penetrate the first conductive layer 110, the first preliminary electrode layer 210, the first switching layer 310, the second preliminary electrode layer 220, the first insulating layer 410, the first heating layer 440, the second spacer film 450, and the second insulating layer 460, in the third direction D3. The first conductive layer 110 may be patterned to form first conductive lines CL1. The first preliminary electrode layer 210, the first switching layer 310, the second preliminary electrode layer 220, the first insulating layer 410, the first heating layer 440, the second spacer film 450, and the second insulating layer 460 may each be divided into a plurality of patterns separated in the first direction D1 by the first patterning process.

Figure 5:
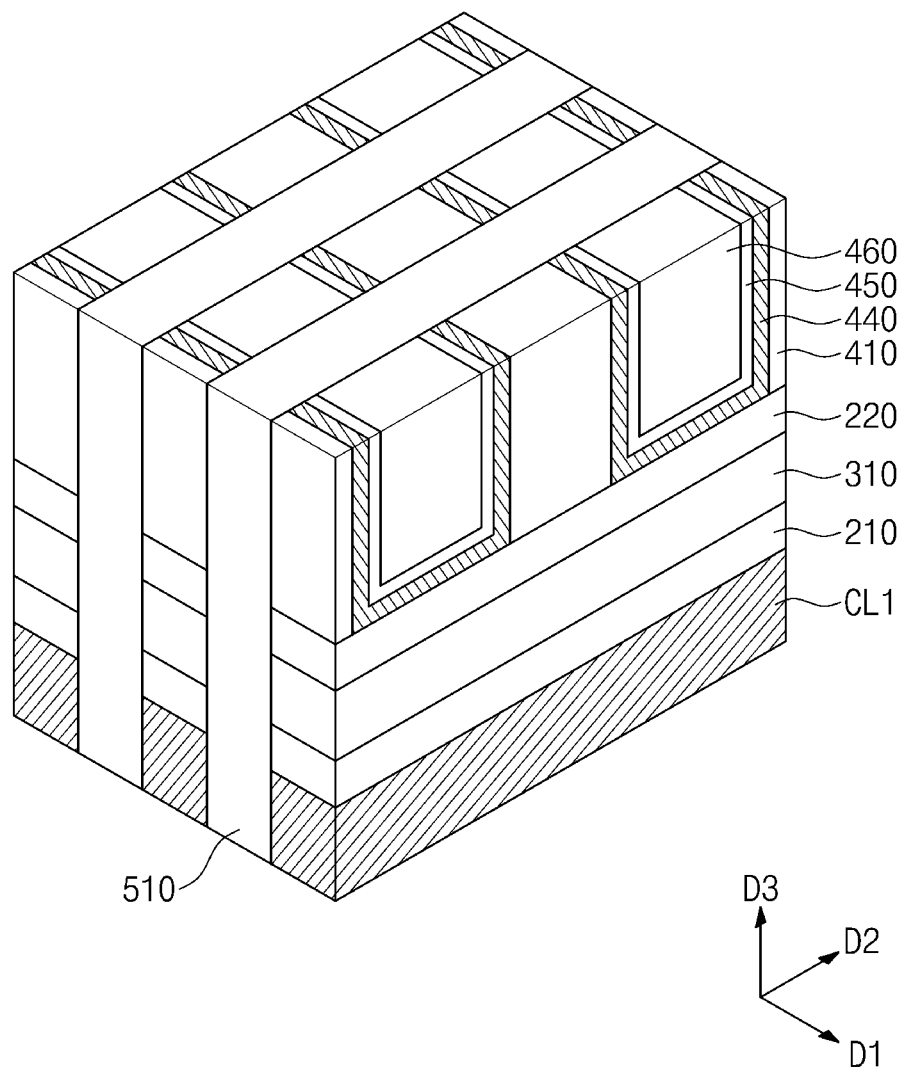

Referring to FIG. 5, the first mask pattern M1 may be removed after the first patterning process. A third insulating layer 510 is formed in the second trench T2. The third insulating layer 510 may include the same material as that of the first and second insulating layers 410 and 460. For example, the third insulating layer 510 may include silicon nitride. In some embodiments, the first mask patterns M1 may be removed after forming the third insulating layer 510.

Figure 6:
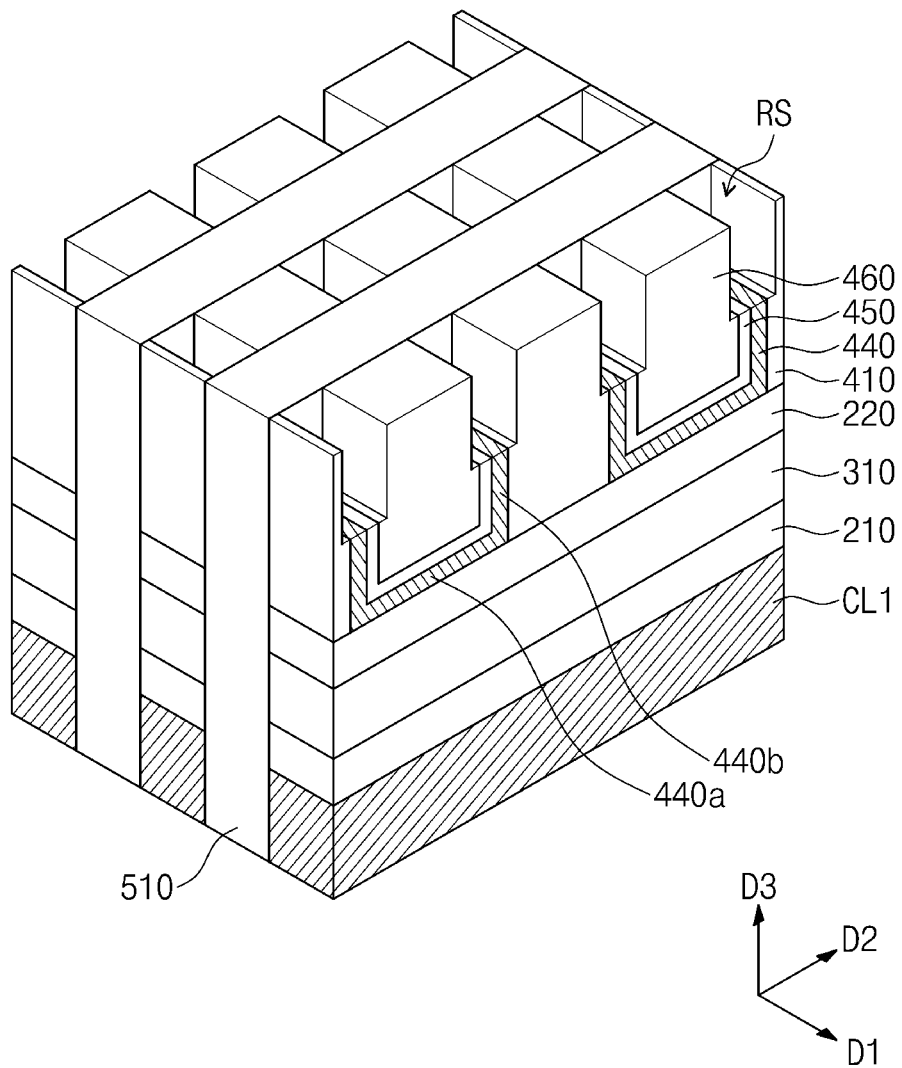

Referring to FIG. 6, upper portions of the first heating layer 440 and the second spacer film 450 are etched. For example, portions of the side sections 440b of the first heating layer 440 may be etched. Upper surfaces of the first heating layer 440 and the second spacer film 450 may be recessed from upper surfaces of the first to third insulating layers 410, 460, and 510 to form recess regions RS, on the first heating layer 440 and the second spacer film 450, surrounded by the first to third insulating layers 410, 460, and 510. For example, upper surfaces of the second spacer film 450 and side sections 440b of the first heating layer 440 may be exposed at a bottom of the recess regions RS, and all other surfaces of the recess regions RS are formed from the first to third insulating layers 410, 460, and 510. Thereafter, an etching process may be performed to enlarge the recess regions RS. For example, the first and second insulating layers 410 and 460 may be selectively etched to enlarge widths of the recess regions RS in the second direction D2.

Figure 7:
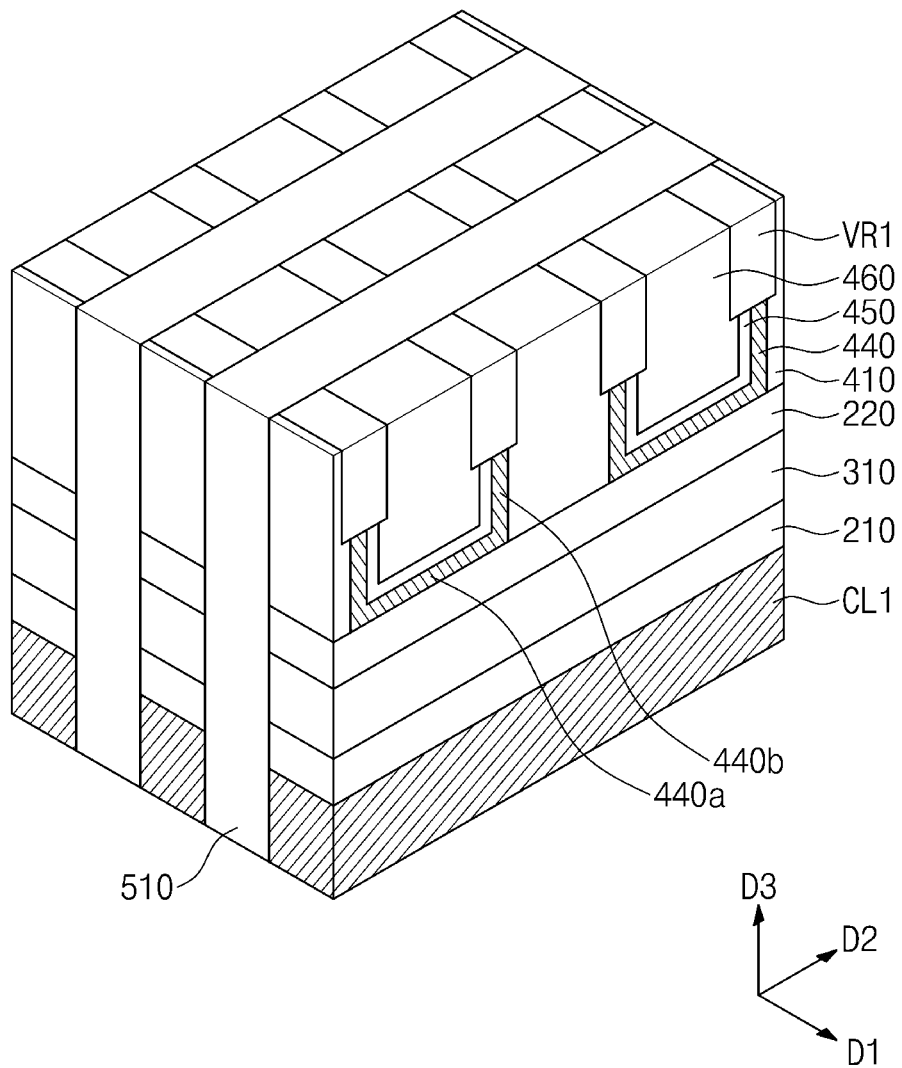

Referring to FIG. 7, first variable resistance patterns VR1 are formed in the recess regions RS, respectively. The first variable resistance patterns VR1 may be disposed on the side sections 440b, respectively, of the first heating layer 440. The first variable resistance patterns VR1 may contact upper surfaces of the side sections 440b of the first heating layer 440 and the upper surface of the second spacer film 450.

The first variable resistance patterns VR1 may include a material capable of storing information (or data). In some embodiments, the first variable resistance patterns VR1 may have a phase-changeable material capable of reversibly changing between a crystal phase and an amorphous phase based on temperature. For example, a phase transition temperature of the first variable resistance patterns VR1 may be from about 250° C. to about 350° C. In some embodiments, the first variable resistance patterns VR1 may include a compound formed by combination of at least one of chalcogen elements, e.g., Te and Se, and at least one of Ge, Sb, Bi, Pb, Sn, Ag, As, S, Si, In, Ti, Ga, P, O and C. For example, the first variable resistance patterns VR1 may include GeSbTe, GeTeAs, SbTeSe, GeTe, SbTe, SeTeSn, GeTeSe, SbSeBi, GeBiTe, GeTeTi, InSe, GaTeSe, and/or InSbTe. In some embodiments, the first variable resistance patterns VR1 may include a super-lattice structure in which a layer including Ge and a layer not including Ge are alternately stacked (e.g., a structure in which a GeTe layer and a SbTe layer are alternately and/or repeatedly stacked).

In some embodiments, the first variable resistance patterns VR1 may include perovskite compounds and/or conductive metal oxides. For example, the first variable resistance patterns VR1 may include niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, and/or barium-strontium-zirconium oxide. In some embodiments, the first variable resistance patterns VR1 may have a double structure of a conductive metal oxide layer/tunnel insulating layer, or a triple structure of a first conductive metal oxide layer/tunnel insulating layer/second conductive metal oxide layer. The tunnel insulating layer may include, e.g., aluminum oxide, hafnium oxide, or silicon oxide.

Figure 8:
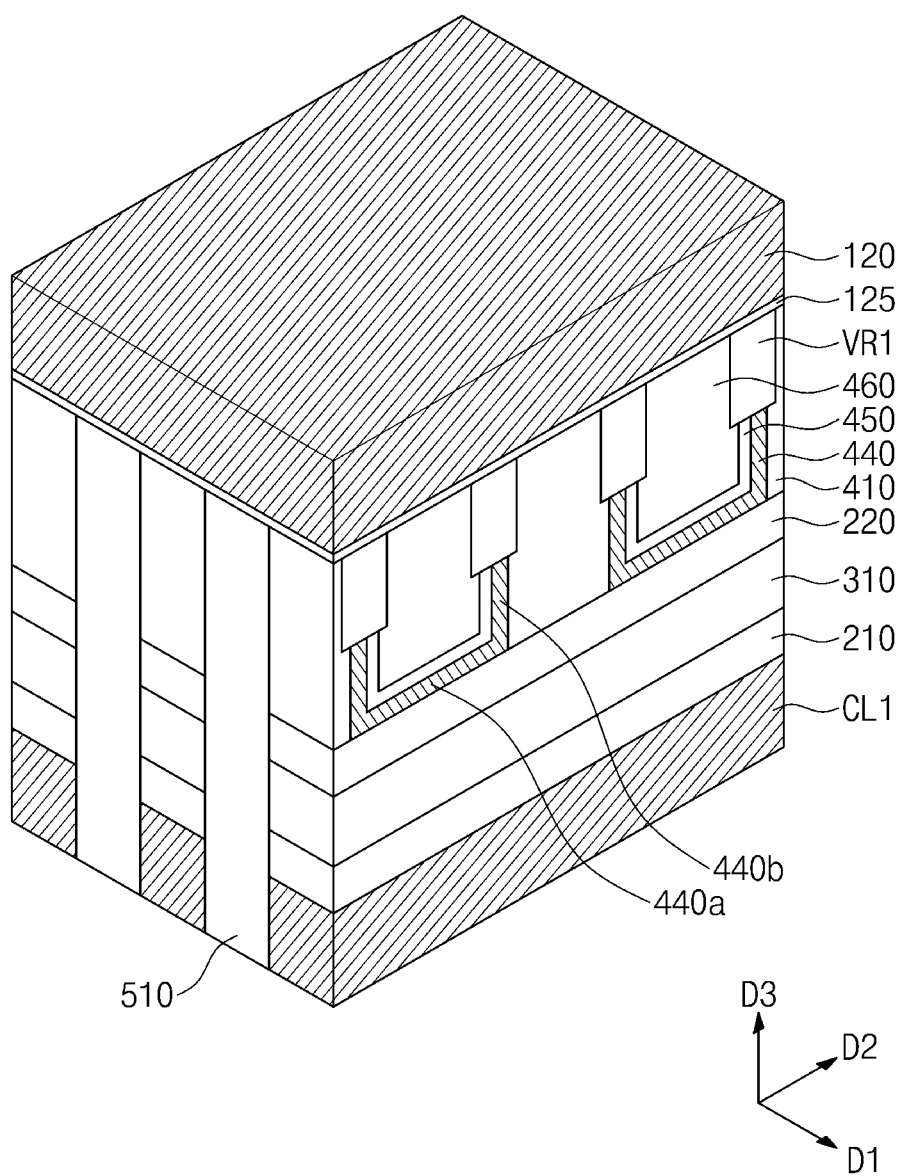
Figure 9:
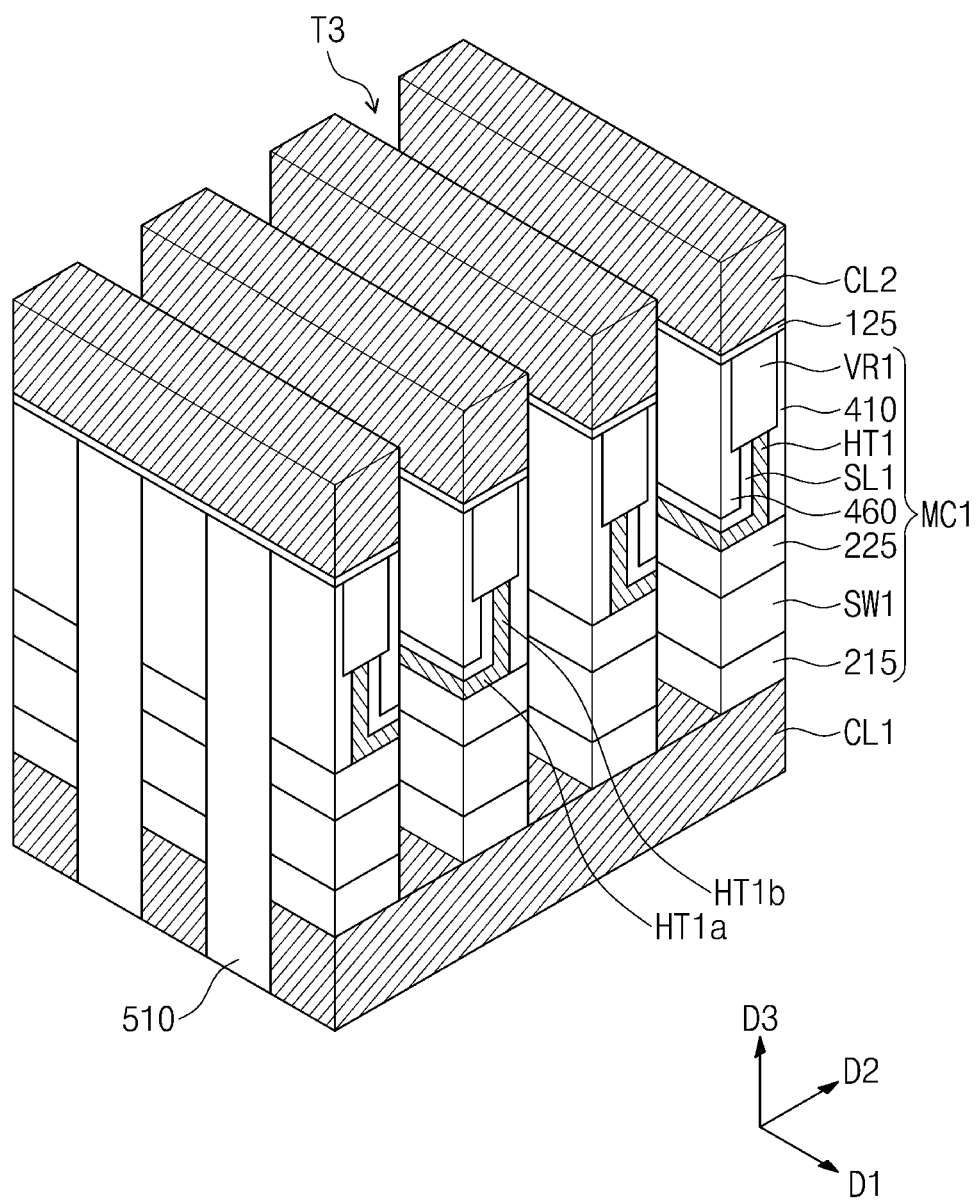

Referring to FIG. 8, a first barrier layer 125 and a second conductive layer 120 are sequentially formed on the first to third insulating layers 410, 460, and 510 and the first variable resistance patterns VR1. The first barrier layer 125 and the second conductive layer 120 may cover the upper surfaces of the first to third insulating layers 410, 460, and 510 and upper surfaces of the first variable resistance patterns VR1. For example, when viewed in a plan view, each of the first barrier layer 125 and the second conductive layer 120 may extend across an entire area of the first to third insulating layers 410, 460, and 510 and the first variable resistance patterns VR1. The first barrier layer 125 may include, e.g., TiN, Ti/TiN, TiSiN, or WN. The second conductive layer 120 may include metal, e.g., Cu or Al, and/or conductive metal nitride, e.g., TiN or WN Referring to FIG. 9, a second patterning process is performed on the second conductive layer 120. For example, after forming mask patterns, that extend in the first direction D1, on the second conductive layer 120, an etching process using the mask patterns as an etch mask may be performed. By the second patterning process, at least one third trench T3, that penetrates the first preliminary electrode layer 210, the first switching layer 310, the second preliminary electrode layer 220, the first insulating layer 410, the first heating layer 440, the second spacer film 450, the second insulating layer 460, the third insulating layer 510, the first barrier layer 125, and the second conductive layer 120 in the third direction D3, is formed. The third trench T3 may not penetrate the first conductive lines CL1, and may expose an upper surface of the first conductive lines CL1. The first variable resistance patterns VR1 may not be etched. In some embodiments, the third trench T3 may be formed between the first variable resistance patterns VR1. For example, first variable resistance patterns VR1 may be disposed on either side of the third trench T3 in the second direction D2. The first variable resistance patterns VR1 may be spaced apart from the third trench T3 in the second direction D2. By the second patterning process, first electrodes 215, first switching patterns SW1, second electrodes 225, first heating patterns HT1, and first spacer patterns SL1, and second conductive lines CL2 are formed. For example, the first preliminary electrode layer 210 and second preliminary electrode layer 220 may be etched to form the first electrode 215 and second electrode 225, respectively. The first switching layer 310 may be etched to form the first switching patterns SW1. The first heating layer 440 may be etched to form the first heating patterns HT1. The second spacer film 450 may be etched to form the first spacer patterns SL1. The first heating patterns HT1 and the first spacer patterns SL1 may respectively have L-shaped cross-sections. The second conductive layer 120 may be patterned to form the second conductive lines CL2. In some embodiments, by the second patterning process, the bottom section 440a of the first heating layer 440 may be etched to be separated into bottom parts HT1a of the first heating patterns HT1. Each first electrode 215, each first switching pattern SW1, each second electrode 225, each first heating pattern HT1, and each spacer pattern SL1 may constitute each first memory cell MC1. For example, each first memory cell MC1 may include a first electrode 215, a first switching pattern SW1, a second electrode 225, a first heating pattern HT1, and a spacer pattern SL1. In each first memory cell MC1, the second electrode 225 may serve as an intermediate electrode for electrically connecting the first switching pattern SW1 and the first heating pattern HT1. As used herein, items described as being "electrically connected" are configured such that an electrical signal can be passed from one item to the other.

Figure 10:
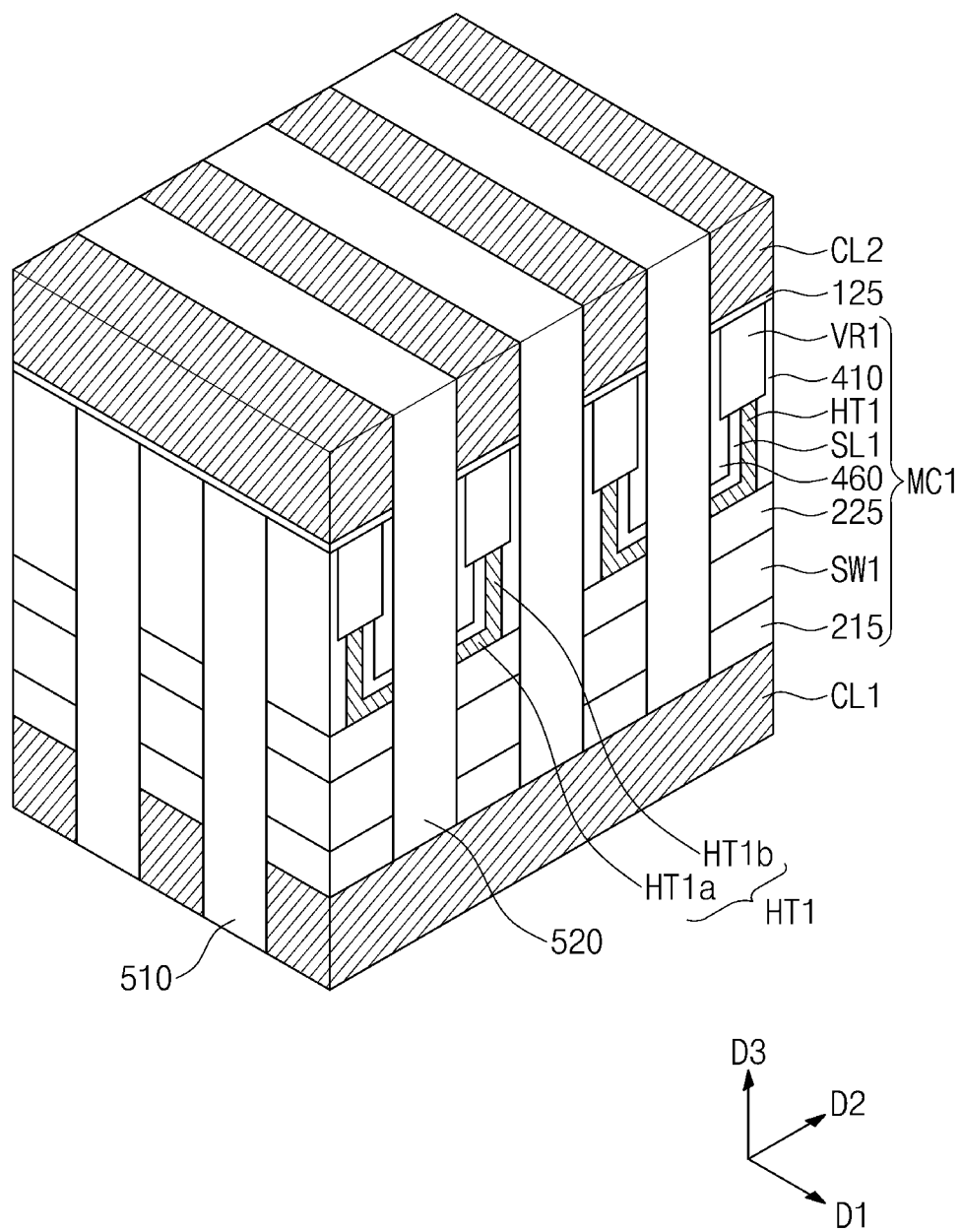

Referring to FIG. 10, after the second patterning process, a fourth insulating layer 520 is formed in the third trench T3. The fourth insulating layer 520 may include the same material as that of the first to third insulating layers 410, 460, and 510. For example, the fourth insulating layer 520 may include silicon nitride. By the above processes, the variable resistance memory device according to example embodiments may be manufactured.

According to example embodiments, when performing the first patterning process for separating the first heating layer 440 in the first direction D1 and the second patterning process for separating the first heating layer 440 in the second direction D2, the first and second conductive layers 110 and 120, the first and second preliminary electrode layers 210 and 220, the first switching layer 310, the first to third insulating layers 410, 460, and 510, and the second spacer film 450 may be patterned together. For example, the patterning processes for separating the first and second conductive layers 110 and 120, the first and second preliminary electrode layers 210 and 220, the first switching layer 310, the first to third insulating layers 410, 460, and 510, and the second spacer film 450 may not be individually performed. Therefore, the number of the patterning processes for forming the first memory cells MC1 may be reduced, thus simplifying the process of forming the memory device.

Further, the first variable resistance patterns VR1 may be buried in the first to third insulating layers 410, 460, and 510 and not be exposed to an etchant during the patterning process, such that the first variable resistance patterns VR1 may not be damaged by the etchant.

Figure 11:
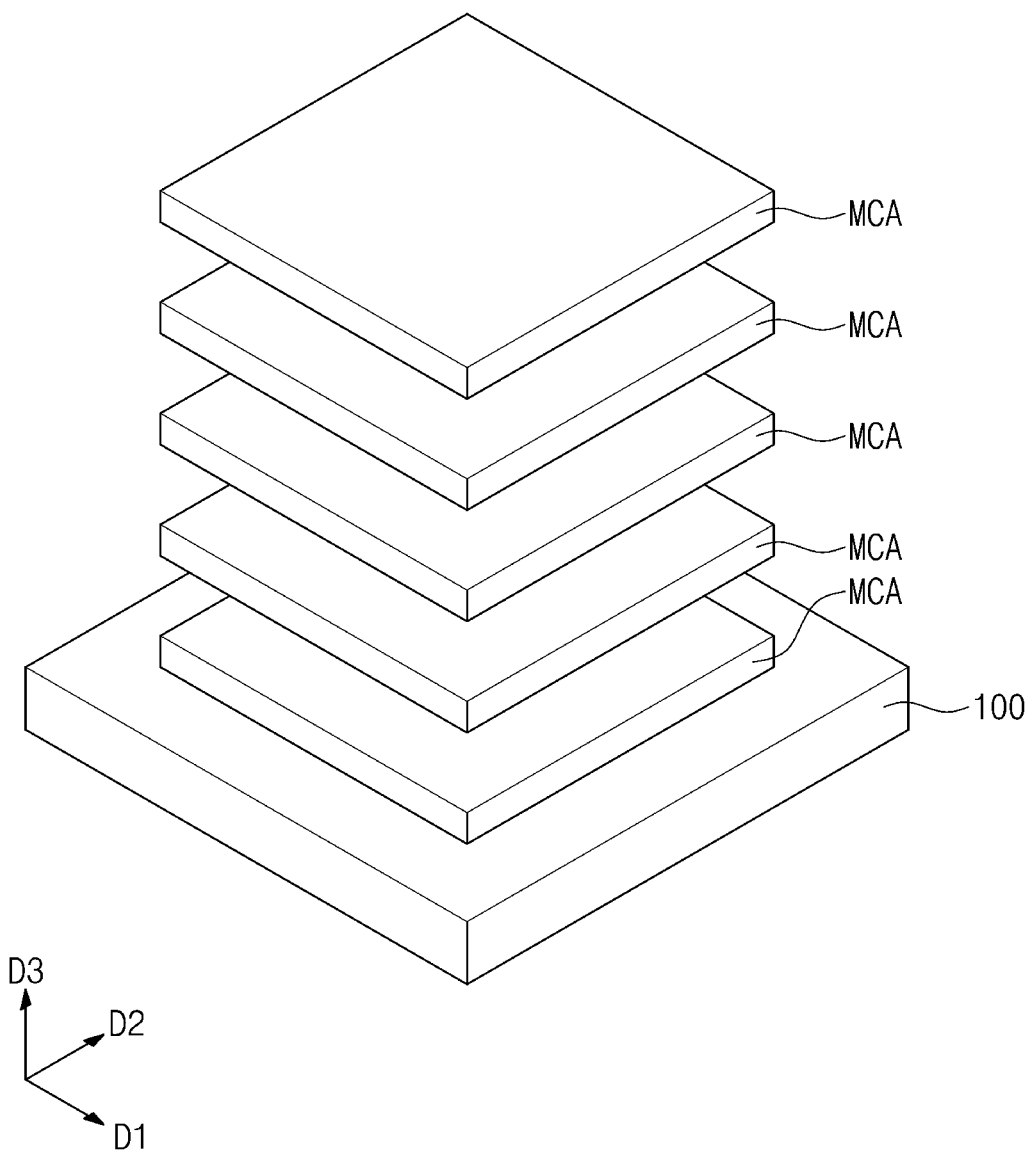
FIG. 11 is a conceptual view of a variable resistance memory device, according to example embodiments.

FIG. 11 is a conceptual view illustrating a variable resistance memory device, according to example embodiments.

Referring to FIG. 11, the variable resistance memory device includes a plurality of cell stack layers MCA that are sequentially stacked on the substrate 100. The memory cell stack layers MCA may each include a plurality of memory cells arranged two-dimensionally. The variable resistance memory device may include a plurality of conductive lines that are disposed between the memory cell stack layers MCA and are provided for writing operations, reading operations, and/or erasing operations of the memory cells. Although five memory cell stack layers MCA stacked on substrate 100 are shown in FIG. 11, example embodiments are not limited thereto.

The variable resistance memory device shown in FIG. 10 may correspond to a single memory cell stack MCA of FIG. 11. Hereinafter, the variable resistance memory device according to example embodiments will be described in detail based on the single memory cell stack MCA.

Referring to FIG. 10, the first conductive lines CL1 and the second conductive lines CL2 are disposed on the substrate (e.g., substrate 100 of FIG. 11). The first conductive lines CL1 may extend in the second direction D2 parallel to each another, and may be spaced apart from each other in the first direction D1. The first conductive lines CL1 may be word lines. The second conductive lines CL2 may be bit lines. The second conductive lines CL2 may be spaced apart from the first conductive lines CL1 in the third direction D3. The second conductive lines CL2 may extend in the first direction D1 parallel to each another, and may be spaced apart from each other in the second direction D2. Each of the second conductive lines CL2 may include the first barrier layer 125 therebelow. The first conductive lines CL1 and the second conductive lines CL2 may include, e.g., metal (e.g., copper, tungsten, or aluminum), and/or metal nitride (e.g., tantalum nitride, titanium nitride, or tungsten nitride). The first barrier layer 125 may include, e.g., TiN, Ti/TiN, TiSiN, TaN, or WN.

The first memory cells MC1 are respectively disposed at intersections between first conductive lines CL1 and the second conductive lines CL2. The first memory cells MC1 may be arranged two-dimensionally in both the first and second directions D1 and D2.

Although the single memory cell stack layer (see, e.g., MCA of FIG. 11) is provided as shown in FIG. 10, the example embodiments are not limited thereto. For example, a plurality of the memory cell stack layers may be stacked on the substrate in the third direction D3 as shown in FIG. 11. In this case, the structures corresponding to the first memory cell MC1 and the first and second conductive lines CL1 and CL2 may be alternately stacked on the substrate.

Each of the first memory cells MC1 includes the first electrode 215, the first switching pattern SW1, the second electrode 225, the first heating pattern HT1, the first spacer pattern SL1, and the first variable resistance pattern VR1. The first electrode 215, the first switching pattern SW1, the second electrode 225, the first heating pattern HT1, the first spacer pattern SL1, and the first variable resistance pattern VR1 of each of the first memory cells MC1 may be connected in series between a pair of the first and second conductive lines CL1 and CL2 that are connected thereto. Hereafter, configuration elements of one of the first memory cells MC1 will be described.

The first electrode 215 may electrically connect the first conductive line CL1 and the first switching pattern SW1. The second electrode 225 may be an intermediate electrode for electrically connecting the first switching pattern SW1 and the first heating pattern Hl. The first electrode 215 and the second electrode 225 may include, e.g., W, Ti, Al, Cu, C, and/or CN.

The first switching pattern SW1 may be an element based on a threshold switching phenomenon having a non-linear (e.g., S-shaped) I-V curve. For example, the first switching pattern SW1 may be an ovonic threshold switch (OTS) element having bi-directional properties. In some embodiments, the first switching pattern SW1 may include a phase-change material capable of reversibly changing between the crystal phase and amorphous phase based on temperature. A phase transition temperature of the first switching pattern SW1 may be from about 350° C. to about 450° C. The first switching pattern SW1 may include a compound formed by combination of at least one of chalcogen elements, e.g., Te and Se, and at least one of Ge, Sb, Bi, Al, Pb, Sn, Ag, As, S, Si, In, Ti, Ga, and P. The first switching pattern SW1 may further include a thermally stabilizing element.

The first variable pattern VR1 may include a material for storing information. The first variable paten VR1 may have a lower phase transition temperature between a crystalline phase and an amorphous phase than that of the first switching pattern SW1. For example, the phase transition temperature of the first variable resistance pattern VR1 may be from about 250° C. to about 350° C. Accordingly, when the variable resistance memory device is operated, while the first variable resistance pattern VR1 may be reversibly phase-changed between the crystal phase and the amorphous phase upon application of operating voltage, the first switching pattern SW1 may maintain a substantially amorphous state without a phase change. Herein, the term "substantially amorphous state" means that a locally crystallized grain boundary—may exist in a portion of an object or a locally crystallized portion may exist in the object. For example, a substantially amorphous state may not exclude the presence of a locally crystalline grain boundary or a locally crystalline portion in an object (e.g., the first switching pattern SW1). The first variable resistance pattern VR1 may include a compound formed by combination of at least one of chalcogen elements, e.g., Te and Se, and at least one of Ge, Sb, Bi, Al, Pb, Sn, Ag, As, S, Si, In, Ti, Ga and P. In some embodiments, the first variable resistance pattern VR1 may include a super-lattice structure in which a layer including Ge and a layer not including Ge are alternately stacked (e.g., a structure in which a GeTe layer and a SbTe layer are alternately and/or repeatedly stacked).

In some embodiments, the first variable resistance pattern VR1 may include perovskite compounds and/or conductive metal oxides. In some embodiments, the first variable resistance pattern VR1 may have a double structure of a conductive metal oxide layer/tunnel insulating layer, or a triple structure of a first conductive metal oxide layer/tunnel insulating layer/second conductive metal oxide layer. The tunnel insulating layer may include, e.g., aluminum oxide, hafnium oxide, or silicon oxide.

The heating pattern HT1 may be disposed between the second electrode 225 and the first variable resistance VR1. The heating pattern HT1 may include the bottom part HT1a and a side part HT1b. The bottom part HT1a may contact an upper surface of the second electrode 225 and extend in the second direction D2 on the second electrode 225. The side part HT1b may extend from an end portion of the bottom part HT1a in the third direction D3 to contact the first variable resistance pattern VR1. The heating pattern HT1 may have an L-shaped cross-section. The first heating pattern HT1 may include a conductive material, e.g., W, Ti, Al, Cu, C, CN, TiN, TiAlN, TiSiN, TiCN, WN, CoSiN, WSiN, TaN, TaCN, TaSiN, and/or TiO.

The first spacer pattern SL1 may be disposed on the first heating pattern HT1. For example, the first spacer pattern SL1 may cover an upper surface of the bottom part HT1a and a sidewall surface of the side part HT1b of the first heating pattern HT1. The first spacer pattern SL1 may have an L-shaped cross-section. The first spacer pattern SL1 may include an insulating material, e.g., silicon oxide. Alternatively, the first spacer pattern SL1 may include a conductive material.

The first heating pattern HT1, the first spacer pattern SL1, and the first variable resistance pattern VR1 may be covered by the first and second insulating layers 410 and 460. For example, the first insulating layer 410 may be disposed on one sidewall of each of the first heating pattern HT1 and the first variable resistance pattern VR1. The second insulating layer 460 may be disposed on another sidewall of the first spacer pattern SL1 and the first variable resistance pattern VR1. The second insulating layer 460 may expose a portion of the one sidewall of the first heating pattern HT1. For example, the bottom part HT1a of the first heating pattern HT1 may extend from the side part HT1b to the fourth insulating layer 520 between the second insulating layer 460 and the second electrode 225. A sidewall of the second insulating layer 460 and the sidewall of the second electrode 225 may be coplanar. For example, a sidewall of the second insulating layer 460 and a sidewall of the second electrode 225 may be on a same plane in the third direction D3. A width of the first variable resistance pattern VR1 in the second direction D2 may be smaller than a width of the second electrode 225 in the second direction D2. The first variable resistance patterns VR1 may be covered by the first and second insulating layers 410 and 460 in the second direction D2 so as not to be exposed.

The first and second insulating layers 410 and 460 may expose the sidewalls of the first heating pattern HT1, the second spacer pattern SL1, and the first variable resistance pattern VR1 in the first direction D1. The sidewalls of the second electrode 225 and the first and second insulating layers 410 and 460 in the first direction D1 may be coplanar with the sidewalls of the first heating pattern HT1, the first spacer pattern SL1, and the first variable resistance pattern VR1 in the first direction D1.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The third and fourth insulating layers 510 and 520 may fill spaces between the first memory cells MC1. The third and fourth insulating layers 510 and 520 may electrically insulate the first memory cells MC1, thus isolating the first memory cells MC1 from one another.

According to example embodiments, a pair of adjacent first memory cells MC1 may be arranged in mirror symmetry with the fourth insulating layer 520 therebetween. For example, among the pair of adjacent first memory cells MC1 in the second direction D2, while the bottom part HT1a of the first heating pattern HT1 of one of the pair of adjacent first memory cells MC1 may extend from the side part HT1b thereof in the second direction D2, the bottom part HT1a of the heating pattern HT1 of another thereof may extend from the side part HT1b thereof in a reverse direction of the second direction D2.

FIGS. 12 to 17 are perspective views illustrating a method of manufacturing a variable resistance memory device according to example embodiments.

Figure 12:
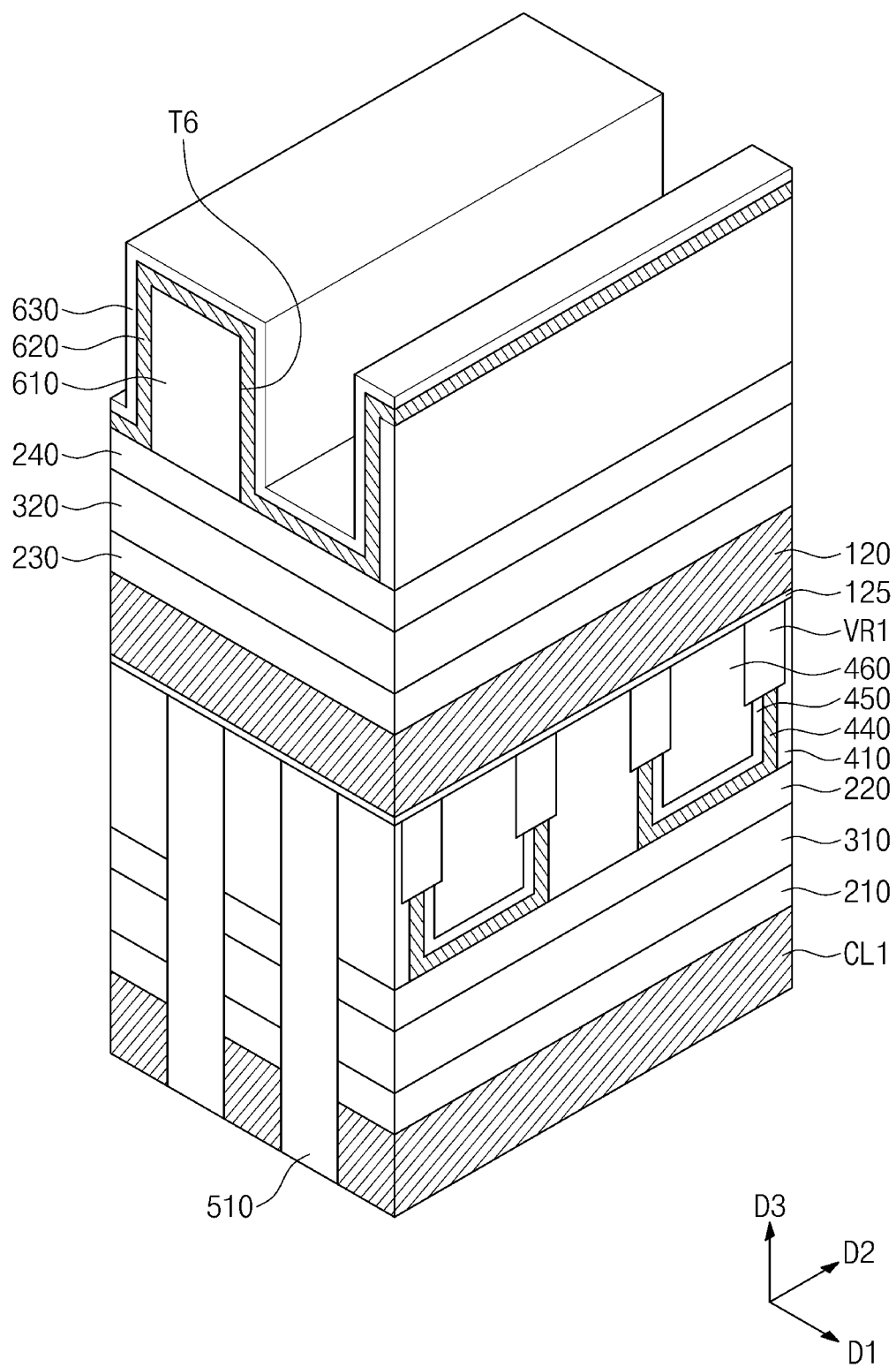
FIGS. 12 to 17 are perspective views illustrating a method of manufacturing a variable resistance memory device, according to example embodiments.

Referring to FIG. 12, a third preliminary electrode layer 230, a second switching layer 320, and a fourth preliminary electrode layer 240 are sequentially stacked on the resulting structure of FIG. 8. The third and fourth preliminary electrode layers 230 and 240 may include a conductive material, e.g., W, Ti, Al, Cu, C, and/or CN. The second switching layer 320 may be an element based on a threshold switching phenomenon having a non-linear (e.g., S-shaped) I-V curve. The second switching layer 320 may be an ovonic threshold switch (OTS) element.

A fifth insulating layer 610 is formed on the fourth preliminary electrode layer 240 and include at least one sixth trench T6 extending in the second direction D2. The fifth insulating layer 610 may include, e.g., silicon nitride.

A second conductive film 620 is formed to conformally cover surfaces of the fifth insulating layer 610 and a portion of an upper surface of the fourth preliminary electrode layer 240 that are exposed by the sixth trench T6. The second conductive film 620 may include a conductive material. A third spacer film 630 is conformally formed on a surface of the second conductive film 620. The third spacer film 630 may include an insulating material, e.g., silicon oxide, or a conductive material, e.g., polysilicon. The third spacer film 630 may have an etch selectivity with respect to the fifth insulating layer 610 and the fourth preliminary electrode layer 240.

Figure 13:
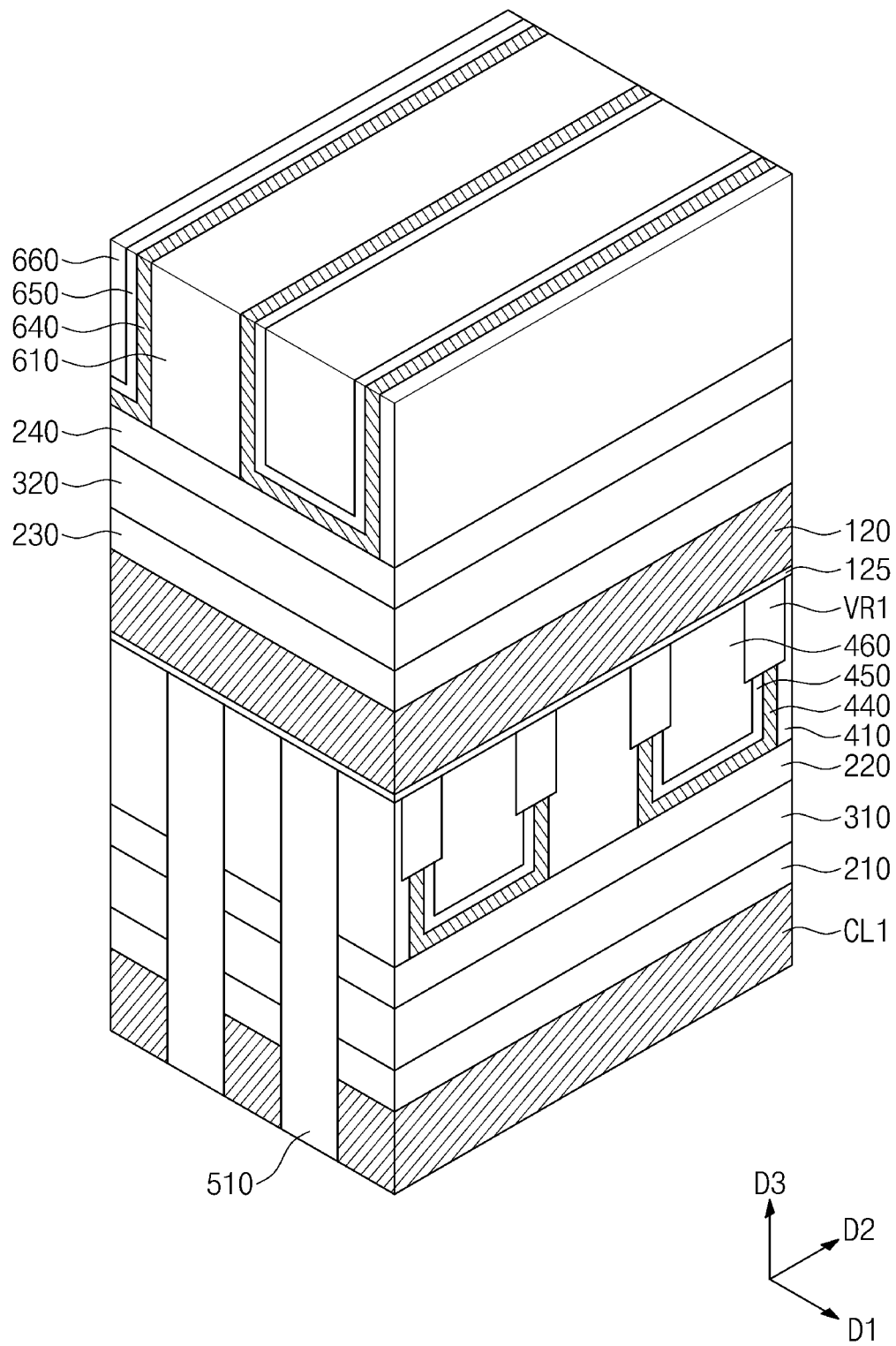

Referring to FIG. 13, a sixth insulating layer 660 is formed on the third spacer film 630. For example, an insulating material may be deposited on the third spacer film 630 to fill a remaining portion of the sixth trench T6, and then a planarization process may be performed on the second conductive film 620, the third spacer film 630, and the insulating material to expose an upper surface of the fifth insulating layer 610. Thus, a second heating layer 640, a fourth spacer film 650, and the sixth insulating layer 660 are sequentially formed in the sixth trench T6. The fifth insulating layer 610, the second heating layer 640, the fourth spacer film 650, and the sixth insulating layer 660 may extend in the second direction D2. The second heating layer 640 and the fourth spacer film 650 may each have a U-shaped cross-section. The sixth insulating layer 660 may include an insulating material (e.g., silicon nitride) having an etch selectivity with respect to the fourth spacer film 650.

Figure 14:
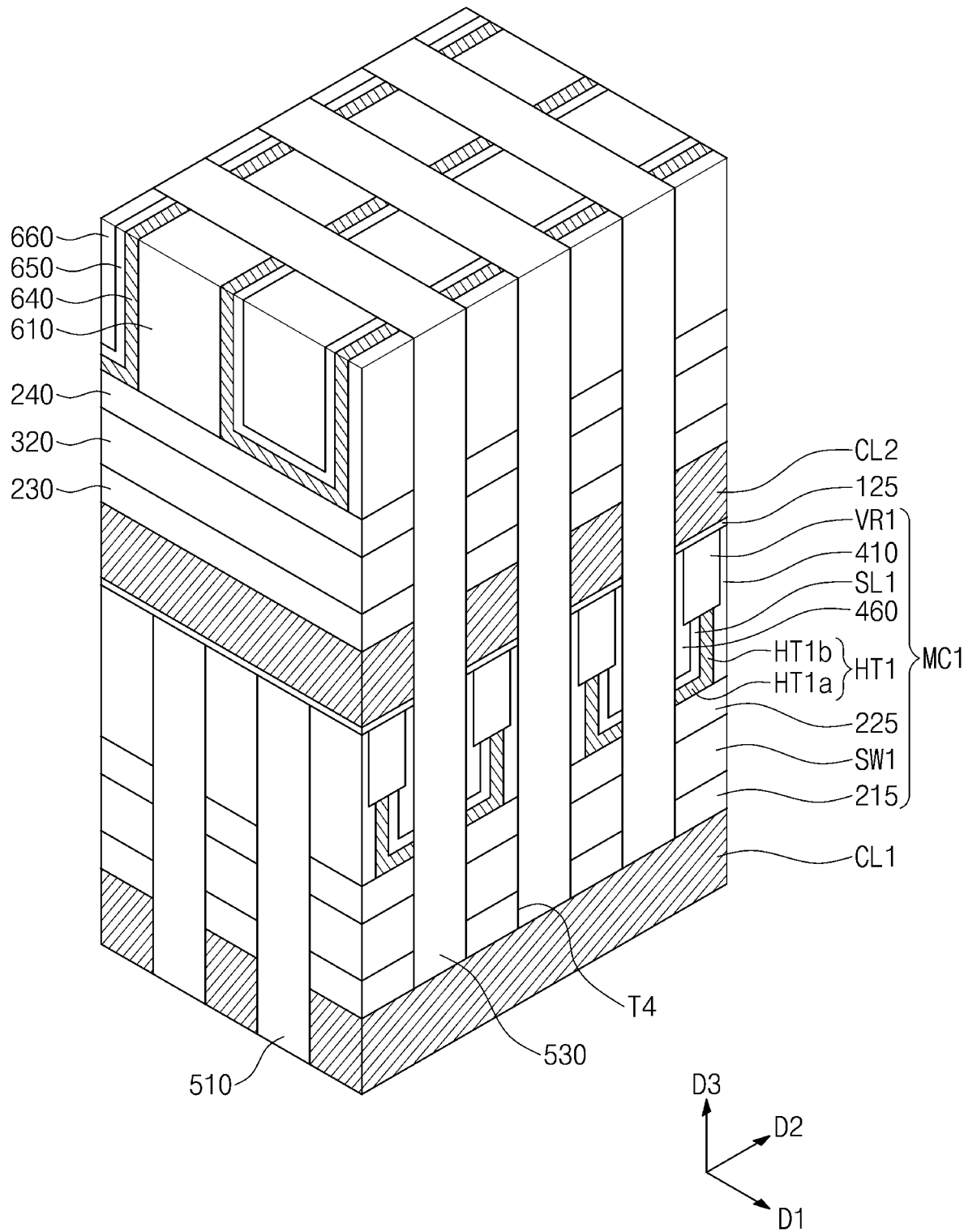

Referring to FIG. 14, a third patterning process is performed on the sixth insulating layer 660. For example, after forming mask patterns, that extend in the first direction D1, on the sixth insulating layer 660, an etching process may be performed using the mask patterns as an etch mask. Thus, a fourth trench T4 is formed to penetrate the first preliminary electrode layer 210, the first switching layer 310, the second preliminary electrode layer 220, the first insulating layer 410, the first heating layer 440, the second spacer film 450, the second insulating layer 460, the third insulating layer 510, the first barrier layer 125, the second conductive layer 120, the third preliminary electrode layer 230, the second switching layer 320, the fourth preliminary electrode layer 240, the fifth insulating layer 610, the second heating layer 640, the fourth spacer film 650, and the sixth insulating layer 660 in the third direction D3. The fourth trench T4 may not penetrate the first conductive lines CL1, and may expose an upper surface of the first conductive lines CL1. The first variable resistance patterns VR1 may not be etched. In some embodiments, the fourth trench T4 may be formed between the first variable resistance patterns VR1. For example, first variable resistance patterns VR1 may be disposed on either side of the fourth trench T4 in the second direction D2. The first variable resistance patterns VR1 may be spaced apart from the fourth trench T4. By the third patterning process, the first electrodes 215, the first switching patterns SW1, the second electrodes 225, the first heating patterns HT1, and the first spacer patterns SL1 and the second conductive lines CL2 are formed. Each first electrode 215, each first switching pattern SW1, each second electrode 225, each first heating pattern HT1, and each spacer pattern SL1 may constitute each first memory cell MC1. For example, each first memory cell MC1 may include a first electrode 215, a first switching pattern SW1, a second electrode 225, a first heating pattern HT1, and a spacer pattern SL1. In each first memory cell MC1, the first heating pattern HT1 and the first spacer pattern SL1 may each have an L-shaped cross-section. The first heating pattern HT1 may include a bottom part HT1a and a side part HT1b. The bottom part HT1a may extend from the side part HT1b in the second direction D2 or in a reverse direction of the second direction D2, on an upper surface of the second electrode 225. The side part HT1b may extend from an end portion of the bottom part HT1a in the third direction D3. After the third patterning process, a seventh insulating layer 530 is formed in the fourth trench T4. The seventh insulating layer 530 may include, e.g., silicon nitride.

Figure 15:
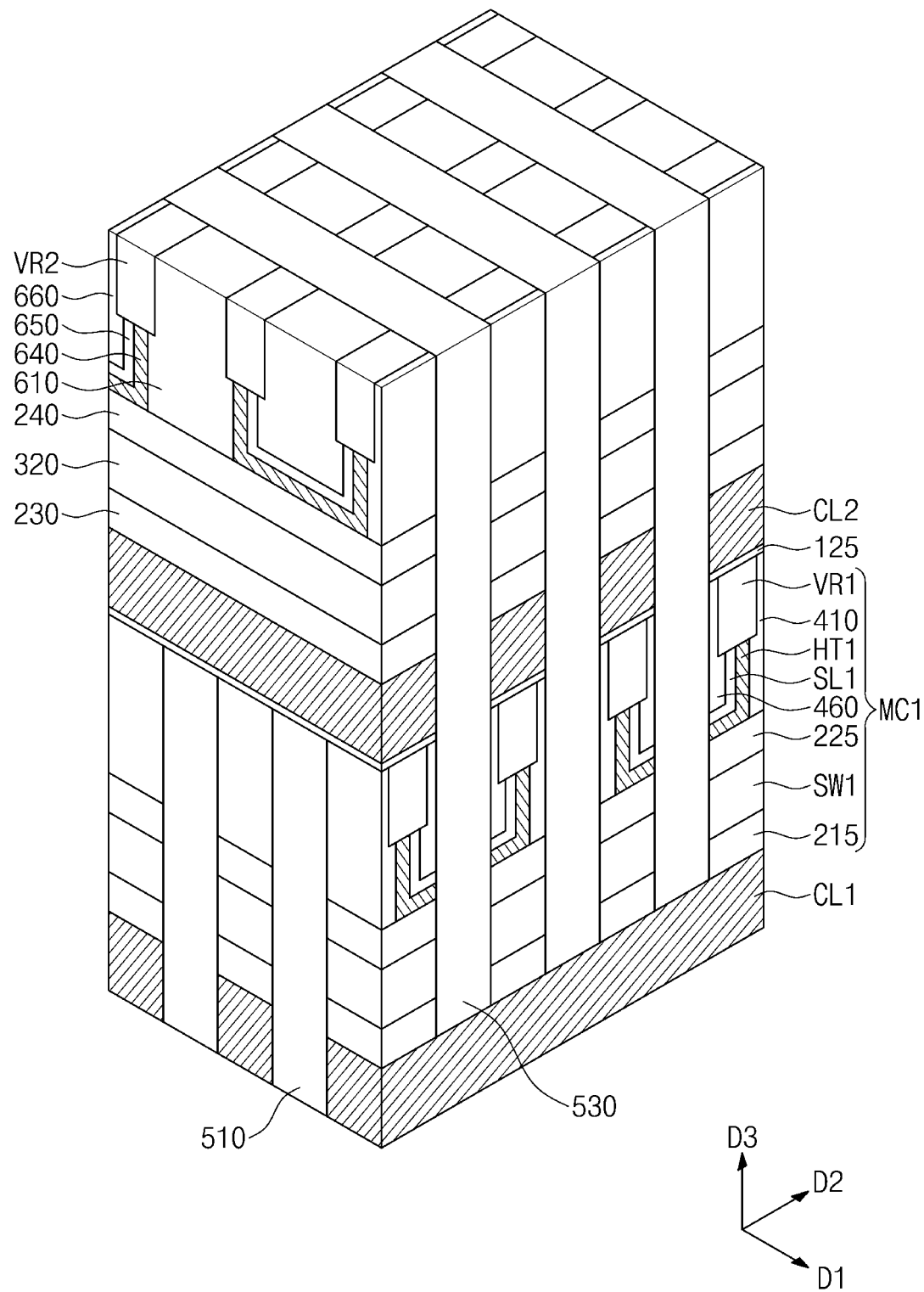

Referring to FIG. 15, upper portions of the second heating layer 640 and the fourth spacer film 650 are etched, thus recessing upper surfaces of the second heating layer 640 and the fourth spacer film 650 from upper surfaces of the fifth to seventh insulating layers 610, 660, and 530 to form recess regions. For example, upper surfaces of the fourth spacer film 650 and the second heating layer 640 may be exposed at a bottom of the recess regions. Thereafter, an etching process may be performed to enlarge widths of the recess regions in the first direction D1.

Second variable resistance patterns VR2 are formed on the second heating layer 640 and the fourth spacer film 650. For example, the second variable resistance patterns VR2 may be formed in the recess regions. The second variable resistance patterns VR2 may be respectively formed on both end portions of the second heating layer 640 that are spaced apart from each other in the first direction D1. The second variable resistance patterns VR2 may contact the upper surfaces of the second heating layer 640 and the fourth spacer film 650.

The second variable resistance patterns VR2 may include a material capable of storing information (or data). In some embodiments, the second variable resistance patterns VR2 may include a phase change material capable of reversibly changing between a crystal phase and an amorphous phase based on temperature.

Figure 16:
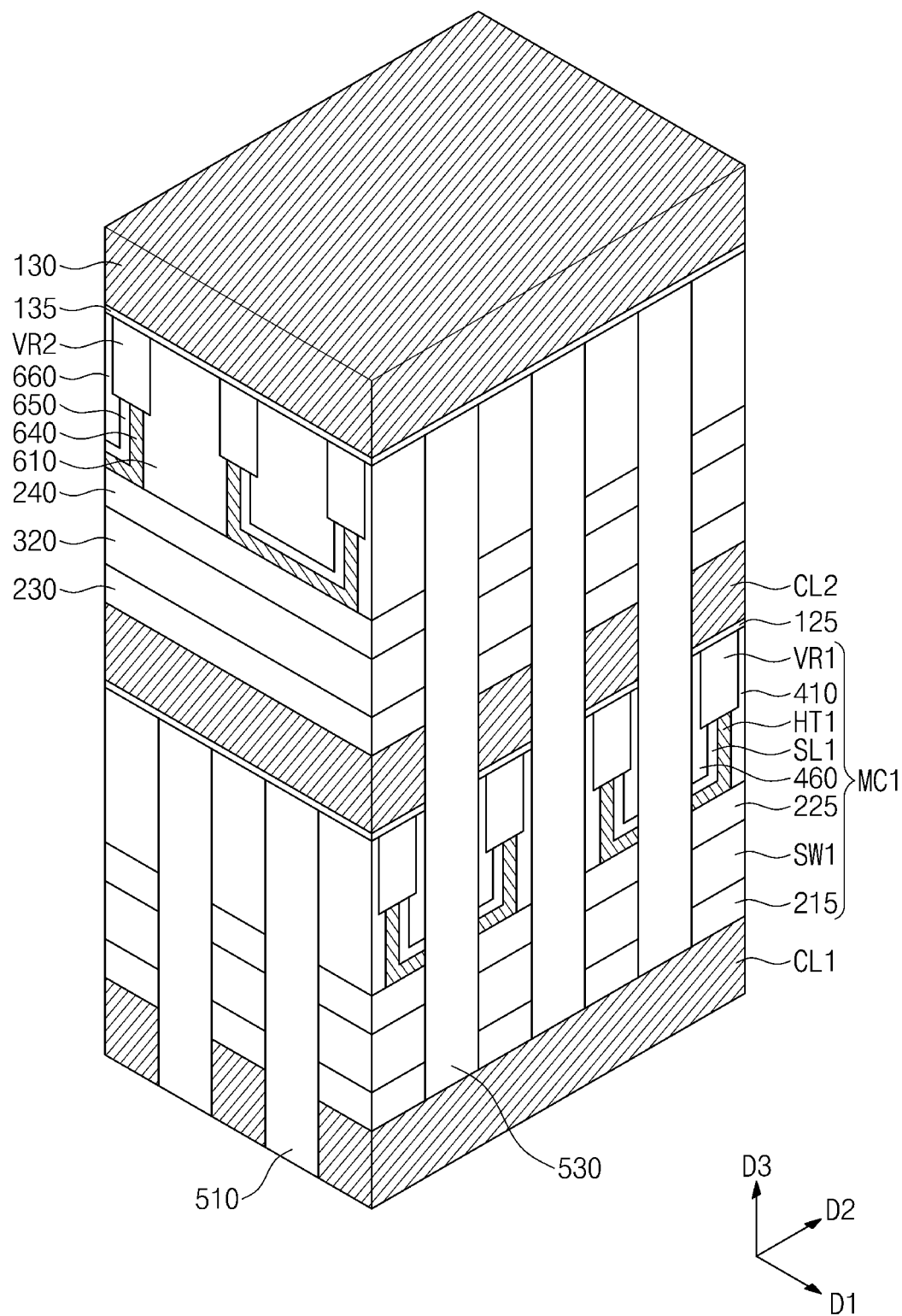

Referring to FIG. 16, a second barrier layer 135 and a third conductive layer 130 are sequentially formed on the fifth to seventh insulating layers 610, 660, and 530 and the second variable resistance patterns VR2. The second barrier layer 135 and the third conductive layer 130 may cover upper surfaces of the fifth to seventh insulating layers 610, 660, and 530 and the second variable resistance patterns VR2. For example, when viewed in a plan view, each of the second barrier layer 135 and the third conductive layer 130 may extend across an entire area of the fifth to seventh insulating layers 610, 660, and 530 and the second variable resistance patterns VR2. The second barrier layer 135 may include, e.g., TiN, Ti/TiN, TiSiN, TaN, or WN. The third conductive layer 130 may include metal, e.g., Cu or Al, and/or a conductive nitride, e.g., TiN or WN.

Figure 17:
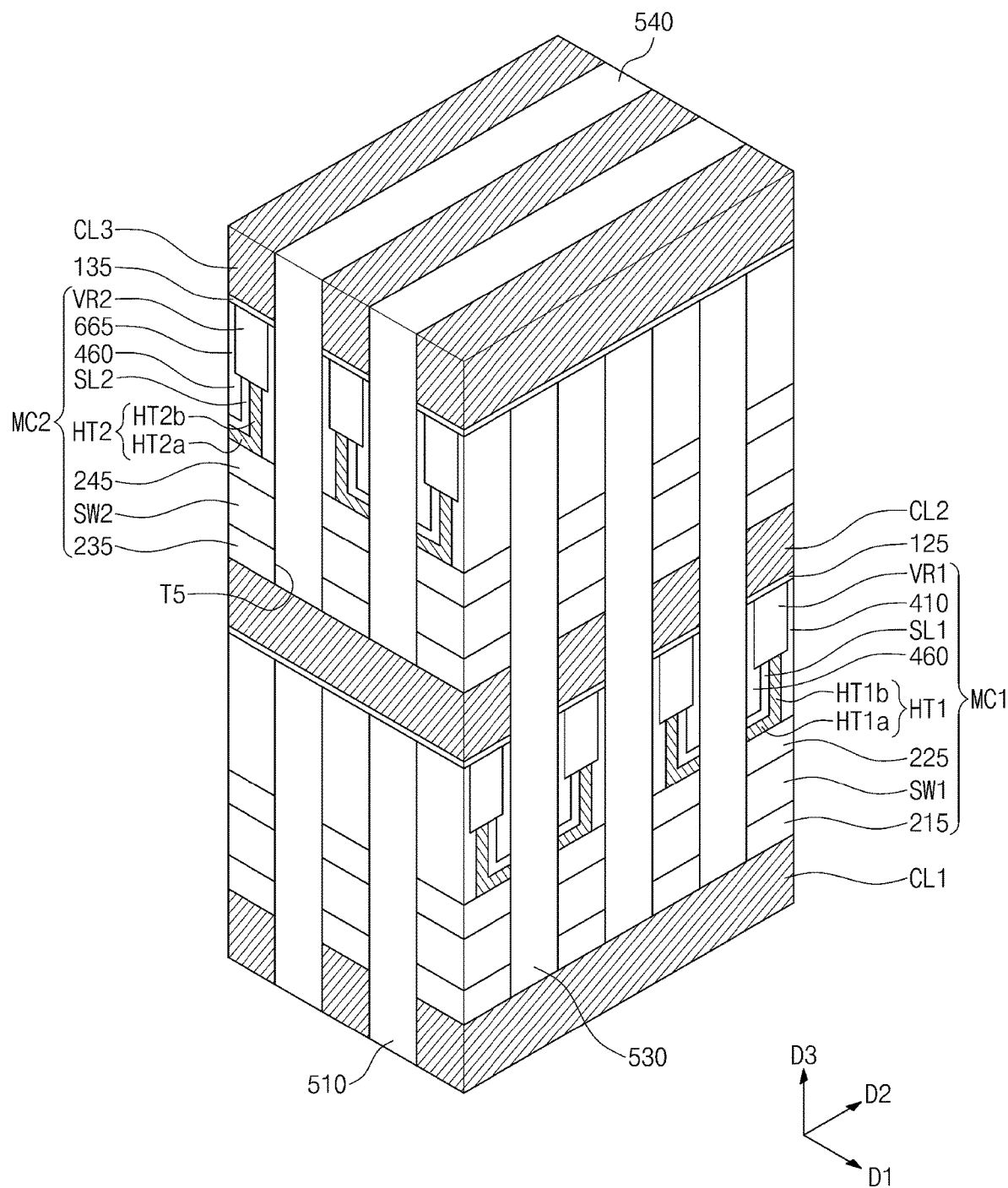

Referring to FIG. 17, a fourth patterning process is performed on the third conductive layer 130. For example, after forming mask patterns, that extend in the second direction D2, on the third conductive layer 130, an etching process may be performed using the mask patterns as an etch mask. Thus, a fifth trench T5 is formed to penetrate the third preliminary electrode layer 230, the second switching layer 320, the fourth preliminary electrode layer 240, the fifth insulating layer 610, the second heating layer 640, the fourth spacer film 650, the sixth insulating layer 660, the seventh insulating layer 530, the second barrier layer 135, and the third conductive layer 130, in the third direction D3. The fifth trench T5 may not penetrate the second conductive lines CL2, and may expose an upper surface of the second conductive lines CL2. The second variable resistance patterns VR2 may not be etched. In some embodiments, the fifth trench T5 may be formed between the second variable resistance patterns VR2. For example, second variable resistance patterns VR2 may be disposed on either side of the fifth trench T5 in the first direction D1. The second variable resistance patterns VR2 may be spaced apart from the fifth trench T5 in the first direction D1. By the fourth patterning process, third electrodes 235, second switching patterns SW2, fourth electrodes 245, second heating patterns HT2, second spacer patterns SL2, and third conductive lines CL3. Each third electrode 235, each second switching pattern SW2, each fourth electrode 245, each second heating pattern HT2, and each second spacer pattern SL2 may constitute each second memory cell MC2. For example, each second memory cell MC2 may include a third electrode 235, a second switching pattern SW2, a fourth electrode 245, a second heating pattern HT2, and a second spacer pattern SL2. In each second memory cell MC2, the fourth electrode 245 may serve as an intermediate electrode for electrically connecting the second switching pattern SW2 and the second heating pattern HT2. In each second memory cell MC2, the second heating pattern HT2 and the second spacer pattern SL2 may each have an L-shaped cross-section. The second heating pattern HT2 may include a bottom part HT2a and a side part HT2b. The bottom part HT2a may extend from the side part HT2b in the first direction D1 or in a reverse direction of the first direction D1, on an upper surface of the fourth electrode 245. The side part HT2b may extend from an end portion of the bottom part HT2a in the third direction D3.

After the fourth patterning process, an eighth insulating layer 540 is formed in the fifth trench T5. The eighth insulating layer 540 may include the same insulating material as that of the fifth to seventh insulating layers 610, 660, and 530. For example, the eighth insulating layer 540 may include silicon nitride. As a result, the variable resistance memory device according to example embodiments may be manufactured.

According to example embodiments, when forming the variable resistance memory device including the plurality of memory cell stacks, at least one of the processes of forming the first memory cells MC1 and at least one of the processes of forming the second memory cells MC2 are performed at the same time. Therefore, the number of the patterning processes for forming the variable resistance memory device may be reduced, thus simplifying the manufacturing process.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of manufacturing a variable resistance memory device, comprising:
   forming a switching layer on a first conductive layer;
   forming a heating layer on the switching layer, the heating layer extending in a first direction;
   performing a first patterning process on the first conductive layer, the switching layer, and the heating layer to form a first trench extending in a second direction intersecting the first direction;
   forming variable resistance patterns on the heating layer;
   forming a second conductive layer on the variable resistance patterns; and
   performing a second patterning process on the switching layer, the heating layer, and the second conductive layer to form a second trench extending in the first direction and being between the variable resistance patterns.

2. The method of claim 1, wherein forming the heating layer comprises:
   forming, on the switching layer, a first insulating layer including a third trench extending in the first direction;
   forming a conductive film extending along a bottom surface and side surfaces of the third trench; and
   forming a second insulating layer on the conductive film to fill the third trench.

3. The method of claim 2, wherein performing the second patterning process comprises:
   moving a portion of the heating layer on the bottom surface of the third trench, which is between the variable resistance patterns in plan view.

4. The method of claim 2, further comprising, before forming the second insulating layer, forming a spacer film in the third trench to conformally cover the conductive film.

5. The method of claim 2, wherein forming the variable resistance patterns comprises:
   etching an upper portion of the conductive film in the third trench to form recess regions;
   enlarging a width in the second direction of each of the recess regions; and
   forming a variable resistance material in the recess regions.

6. The method of claim 1, wherein the variable resistance patterns are spaced apart from the second trench in the second direction.

7. The method of claim 1, wherein the variable resistance patterns are disposed on both end portions of the heating layer in the second direction.

8. The method of claim 1, further comprising:
   forming a third insulating layer to fill the first trench; and
   forming a fourth insulating layer to fill the second trench.

9. The method of claim 1, further comprising, before forming the second conductive layer, forming a barrier layer on the variable resistance patterns.

10. A method of manufacturing a variable resistance memory device, comprising:
    sequentially forming a first conductive layer, a first switching layer, and a first heating layer, the first heating layer extending in a first direction;
    patterning the first conductive layer, the first switching layer, and the first heating layer to form a first trench extending in a second direction intersecting the first direction;
    forming first variable resistance patterns on the first heating layer;
    stacking a second conductive layer, a second switching layer, and a second heating layer on the first variable resistance patterns, the second heating layer extending in the second direction;
    patterning the first switching layer, the first heating layer, the second conductive layer, the second switching layer, and the second heating layer to form a second trench extending in the first direction, the second trench being between the first variable resistance patterns;
    forming second variable resistance patterns on the second heating layer;
    forming a third conductive layer on the second variable resistance patterns; and
    patterning the second switching layer, the second heating layer, and the third conductive layer to form a third trench extending in the second direction, the third trench being between the second variable resistance patterns.

* * * * *